(12) United States Patent
Mueller

(10) Patent No.: US 9,986,626 B2
(45) Date of Patent: May 29, 2018

(54) METHOD OF INDEPENDENTLY CONTROLLING COMPUTER LIGHTING

(71) Applicant: Michael Thomas Mueller, Jarrell, TX (US)

(72) Inventor: Michael Thomas Mueller, Jarrell, TX (US)

(*) Notice: Subject to any disclaimer, the term of this patent is extended or adjusted under 35 U.S.C. 154(b) by 407 days.

(21) Appl. No.: 14/746,855

(22) Filed: Jun. 23, 2015

(65) Prior Publication Data

US 2015/0351206 A1 Dec. 3, 2015

Related U.S. Application Data

(62) Division of application No. 13/409,606, filed on Mar. 1, 2012, now Pat. No. 9,113,537.

(51) Int. Cl.
| | |
|---|---|
| *H05K 3/30* | (2006.01) |
| *H05B 41/44* | (2006.01) |
| *H05K 13/04* | (2006.01) |
| *H05B 41/28* | (2006.01) |
| *H01J 9/24* | (2006.01) |
| *H05B 41/36* | (2006.01) |

(52) U.S. Cl.
CPC .............. *H05B 41/44* (2013.01); *H01J 9/244* (2013.01); *H05B 41/28* (2013.01); *H05B 41/36* (2013.01); *H05K 13/04* (2013.01); *Y10T 29/4913* (2015.01); *Y10T 29/49117* (2015.01)

(58) Field of Classification Search
CPC ........ H05B 41/44; H05B 41/28; H05B 41/36; H05B 41/285; H05K 13/04; H01J 9/2445; H06F 1/181; Y10T 29/4913; Y10T 29/49117; Y10T 29/49128; Y10T 29/49; Y10T 29/49133
USPC ....................... 29/831, 832; 315/200 A, 307
See application file for complete search history.

(56) References Cited

U.S. PATENT DOCUMENTS

| | | | |
|---|---|---|---|
| 7,315,298 B2 * | 1/2008 | Lee .......................... | G06F 1/181 315/200 A |
| 8,247,982 B2 * | 8/2012 | Lee .................... | H05B 41/2855 315/307 |

OTHER PUBLICATIONS

4 Port CCFL Inverter with Alum Housing. Product Datasheet [online], Lamptron. [retrieved on Apr. 28, 2015]. Retrieved from the Internet: <URL:www.lamptron.com/product/legacy/4-port-ccfl-inverter-with-alum-housing/>.
8 Port CCFL Inverter with Alum Housing. Product Datasheet [online], Lamptron. [retrieved on Apr. 28, 2015] Retrieved from the Internet: <URL:http://www.lamptron.com/product/legacy/8-port-ccfl-inverter-with-alum-housing/>.

(Continued)

*Primary Examiner* — Donghai D Nguyen

(57) ABSTRACT

The present invention relates to a method and system that provides independent control over lighting within a computer case. Each inverter module is provided with its own switch to facilitate independent control of illumination. Preferably, the switches are located in a bus that fits within a drive bay and the inverter is directly mounted onto the housing that contains the switch. In another embodiment, the inverter is integrated in a printed circuit board that is inserted into the card slots (e.g. ISA, VESA, PCI, and PCI-Express card slot) on the mother board of the computer. Therefore, the on and off of CCFL inverter can be controlled by software application through the ISA, VESA, PCI, or PCI-Express bus.

6 Claims, 7 Drawing Sheets

(56) References Cited

OTHER PUBLICATIONS

Charles, Lamptron Fan-Atic 5-Channel Fan Controller Review, Product Review [online], Legit Reviews, Published Mar. 10, 2011, [retrieved on Apr. 28, 2015]. Retrieved from the Internet: <URL:www.legitreviews.com/lamptron-fan-atic-5-channel-fan-controller-review_1550>.
Fan-Atic: 5-port—Lamptron. Product Datasheet [online], Lamptron. [retrieved on May 6, 2015], Retrieved from the Internet: <URL: www.lamptron.com/product/controllers/fan-atic-5-port/>.
Nexus Fan & Light Controller. Installation Guide [online], Vantec Thermal Technologies, Inc. [retrieved on Feb. 23, 2015]. Retrieved from the Internet: <URL:www.vantecusa.com/pdf/nxp301.pdf>.
Moersch, Siggy. Case Modding: Enlightening Lighting. Technology Review [online], Tom's Hardware, Published May 19, 2005, [retrieved on May 6, 2015]. Retrieved from the Internet: <URL: www.tomshardware.com/print/case-modding,reviews-1910.html>.
Nexus Fan & Light Controller NXP-305. Datasheet [online]. Vantec Thermal Technologies, Inc., [retrieved on May 6, 2015]. Retrieved from the Internet: <URL:www.vantecusa.com/pdf/nxp305flyer.pdf>.
Ball, Craig. Review: Vantec Nexus Fan Controller. Product Review [online]. HEXUS.net., Published Oct. 12, 2003, [retrieved on May 6, 2015]. Retrieved from the Internet: <URL: www.hexus.net/tech/reviews/cooling/633-vantec-nexus-fan-controller>.
12" Blue Cold Cathode Kit. Product Literature [online]. Logisys Computer Inc., [retrieved on May 6, 2015]. Retrieved from the Internet: <URL: www.logisyscomputer.com/viewsku.asp?SKUID=CLK12BL&DID=CCFLKIT>.

\* cited by examiner

METHOD OF INDEPENDENTLY CONTROLLING COMPUTER LIGHTING

CROSS-REFERENCE TO RELATED APPLICATIONS

This application is a divisional of U.S. patent application Ser. No. 13/409,606 filed Mar. 1, 2012.

BACKGROUND OF THE INVENTION

Field of the Invention

The present invention relates to a method and system of controlling computer lighting, and more particularly to a method and system that provides independent control over lighting within a computer case.

Description of Related Art

Increasingly, lighting is used within computer cases for both decorative and functional purposes. For example, the lighting may be used to display the inner components of the computer, to enable visualization of the proper component operation (e.g. to ensure that a fan is still spinning), or to enable visualization of labels such as service tags. One of the common forms of lighting used within computers is cold cathode fluorescent lighting (CCFL). Light emitting diodes, or LEDs, are a second type of lighting that may be used. In the current state of the art, cold cathode fluorescent lights are generally attached to a switch which is mounted typically in a rear slot of the case. The switch is connected to an inverter, and the inverter is connected to the cold cathode fluorescent light. The inverter takes a voltage from the computer power supply (e.g. 12 V or 5V), and raises it to a higher voltage in order to operate the cold cathode fluorescent light. The inverter may allow for one or often two cold cathode fluorescent lights to be powered off of it. While the switches are typically located in a slot in the rear of the computer, it would be advantageous to have the switches on the front panel of the computer, particularly in a drive bay. The drive bay could be either 5.25" or 3.5" or 2.5" or any standard size adapted within the computer industry.

There are several disadvantages with the current state of the art. First, when using a plurality of cold cathode fluorescent lights, independent control is lost as a single switch is used to control one or more cathodes. Independent control is desirable, particularly when there are cathodes of different colors and one would like the option to choose a specific color or combination of colors for the lighting, as well as to have the option to manually adjust the lighting.

In order to have independent control of the lights, multiple inverters and multiple switches are required. In the current state of the art, the inverters are contained in separate enclosures and must be housed within the computer case. This may be disadvantageous since the inverter modules are typically attached using double sided tape or Velcro to one of the walls of the case, and may restrict airflow which is critical for the cooling of today's high speed computers, which typically operate at clock frequencies above 2 GHz. In addition, the use of multiple switches, which each occupy a slot in the rear of the case, prevents other devices from being placed in those slots. In addition, placement of the inverters can be a time-consuming process, relative to the invention disclosed herein.

Numerous products involving CCFL lighting for personal computer applications are available from manufacturers and distributors. Companies involved in their production and sale include Logisys, Lamptron, Xoxide.com, and Newegg.com. U.S. Pat. No. 7,315,298 (Apparatus for controlling CCFL and method for operating the same) pertains to CCFL lighting control. However, this patent is significantly different from the invention disclosed herein in that it uses a sound wave to alter the lighting control.

Lamptron and other manufacturers produce baybus controllers for personal computers intended to control computer case fans. These controllers cannot be directly connected to CCFL inverters because the connector type used to interface between the baybus controller and CCFL inverter are different. Identification of the appropriate connectors, wiring the connectors together, soldering of the connections, and proper insulation is required to use these baybus switch products with an externally located CCFL inverter. In addition, these products do not physically mount the CCFL inverter onto the baybus, where it would minimize case real estate and air flow obstructions. Lamptron also produces a 4 port CCFL inverter as well as an 8 port CCFL inverter, which allows a single power connection from the power supply to power multiple CCFL lights. Their product enables multiple CCFL lights to be driven from a single enclosure containing multiple inverters. However, no independent control over the lighting and no on-board means for switching are provided in this product.

Therefore, there exists a need for a method and system that provides independent control over the CCFL lighting within a computer case and such method and system should not restrict airflow within computer or be a time-consuming process.

SUMMARY OF THE INVENTION

One object of the present invention is to provide for independent control over lighting within the computer case.

Another object of the present invention is to provide independent control over lighting within the computer case without restricting airflow inside the computer.

Yet another object of the present invention is to provide independent control over lighting within the computer without restricting the airflow inside the computer and such method and system to result in a time-efficient process for assembly of the lighting configuration.

The invention provides for independent control over computer case lights. Each inverter module is provided with its own switch to facilitate independent control of illumination. The switches may be mechanically and/or electrically actuated. Preferably, mechanical switches are located on a baybus that fits within a drive bay, either 5.25" or 3.5", or 2.5" or any standard size developed within the computer industry.

In one embodiment, the CCFL inverter circuit board is directly mounted onto the housing of the baybus containing switches that fits within a 5.25" drive bay, 3.5" drive bay, or 2.5" drive bay. The CCFL inverter circuit board can be mounted vertically or horizontally onto the housing. The best mode of the invention is to mount the CCFL inverter circuit board vertically onto the housing placing the CCFL inverter adjacent to switch mounting point. In a second embodiment, the CCFL inverters may be embedded onto the switch controller circuit board.

In a third preferred embodiment, the CCFL inverter is placed onto a printed circuit board such as the ISA, VESA, PCI, or PCI-Express card that would insert into a card slot of the computer, for example, an ISA, VESA, PCI, or PCI-Express card slot. The CCFL inverter may be controlled by electrically actuated switches via software application through edge connector of the ISA, VESA, PCI, or PCI-Express card.

By utilizing a software application, the embodiment has automatic control over the lighting, it can automatically adjust the color within the computer case based on a timer, a preset algorithm, or based on measurement events such as the amount of processing power being utilized by the computer, the amount of memory being utilized, the temperature of components, or by external triggers obtained through a network, such as the internet.

Optionally, a plurality of mechanically actuated switches offering independent control over the lights may be located on the back of the card (for example, ISA, VESA, PCI, or PCI-Express card) slot and will be accessible at the rear of the computer case when inserted into the corresponding card slot.

Another embodiment of the present invention has a baybus switch containing an embedded CCFL inverter wherein the switch is connected to both a CCFL inverter and a case fan and may be used to control either the CCFL inverter or the case fan or both.

The more important features of the invention have thus been outlined in order that the more detailed description that follows may be better understood and in order that the present contribution to the art may better be appreciated. Additional features of the invention will be described hereinafter and will form the subject matter of the claims that follow.

Before explaining at least one embodiment of the invention in detail, it is to be understood that the invention is not limited in its application to the details of construction and the arrangements of the components set forth in the following description or illustrated in the drawings. The invention is capable of other embodiments and of being practiced and carried out in various ways. Also it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

The foregoing has outlined, rather broadly, the preferred feature of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention and that such other structures do not depart from the spirit and scope of the invention in its broadest form.

BRIEF DESCRIPTION OF THE DRAWINGS

Other aspects, features, and advantages of the present invention will become more fully apparent from the following detailed description, the appended claims, and the accompanying drawings in which similar elements are given similar reference numerals.

DESCRIPTION OF THE PREFERRED EMBODIMENT

Figure 1:
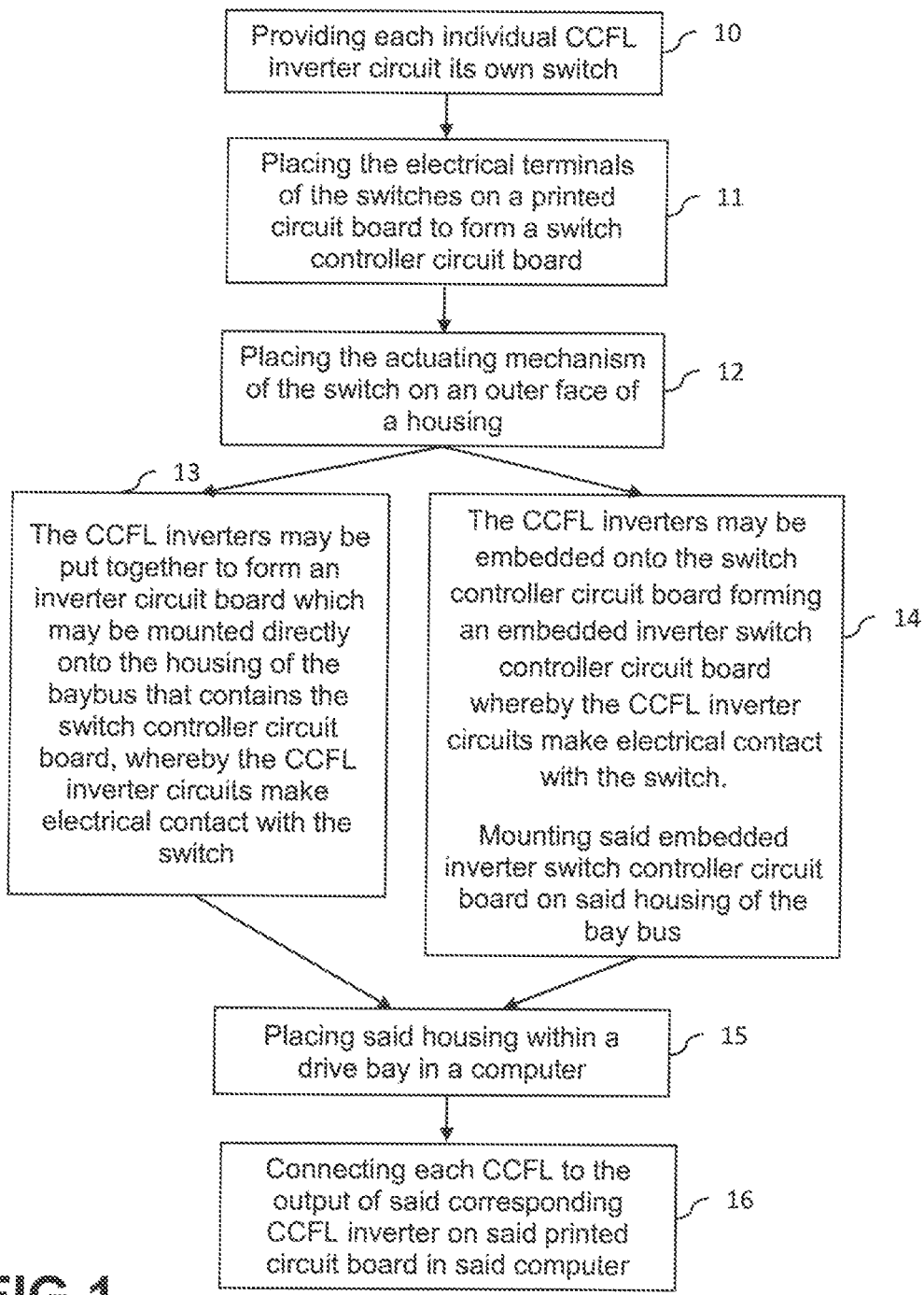
FIG. 1 shows a flow diagram of a method of independently controlling cold cathode florescent lamp (CCFL) lighting inside a drive bay within a computer case through mechanical switches according to the principles of the invention.

Referring to FIG. 1, there is shown a flow diagram of a method of independently controlling cold cathode florescent lamp (CCFL) lighting within a computer case through mechanical switches according to the principles of the invention. At the first step, each individual CCFL inverter circuit is provided its own switch, block 10. Then, the electrical terminals of the switches are placed on a printed circuit board and the actuating means of the switches are placed on an outer face of a housing, blocks 11 and 12. The CCFL inverter modules may be put together to form an inverter circuit board that is mounted directly onto the housing of the baybus that already contains the switch controller circuit board whereby the CCFL inverter circuits make electrical contact with the switch, block 13. Alternatively, the CCFL inverter may be embedded onto the switch controller circuit board whereby the CCFL inverter circuits make electrical contact with the switch, block 14. Then said housing is placed within a drive bay, blocks 15. Thereafter, each CCFL is connected to the output of the corresponding CCFL inverter, block 16.

Figure 2:
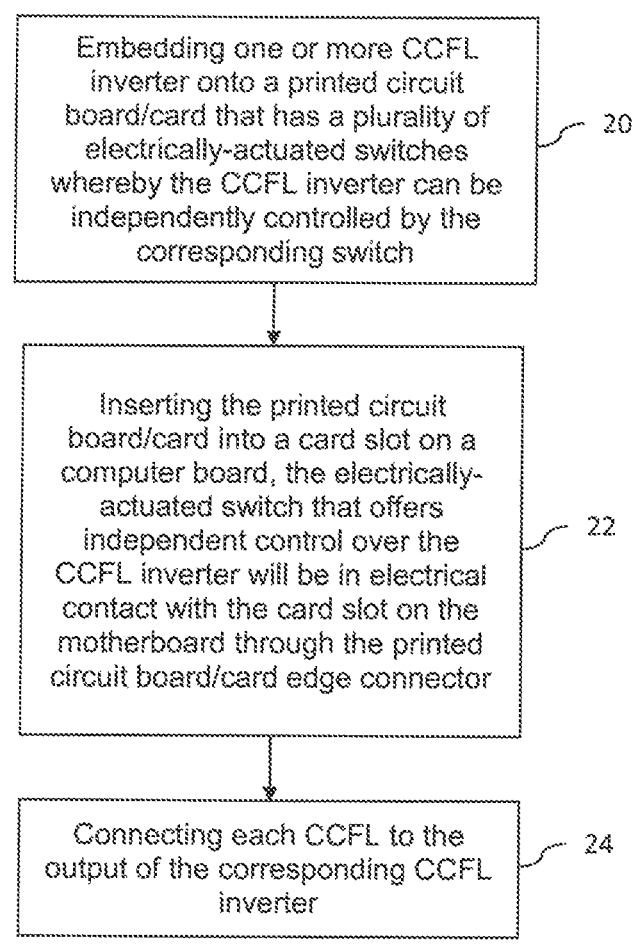
FIG. 2 shows a flow diagram of a method of independently controlling cold cathode florescent lamp (CCFL) lighting within a computer case using electrically actuated switches via software application through edge connector of the ISA, VESA, PCI, or PCI-Express card.
Figure 3:
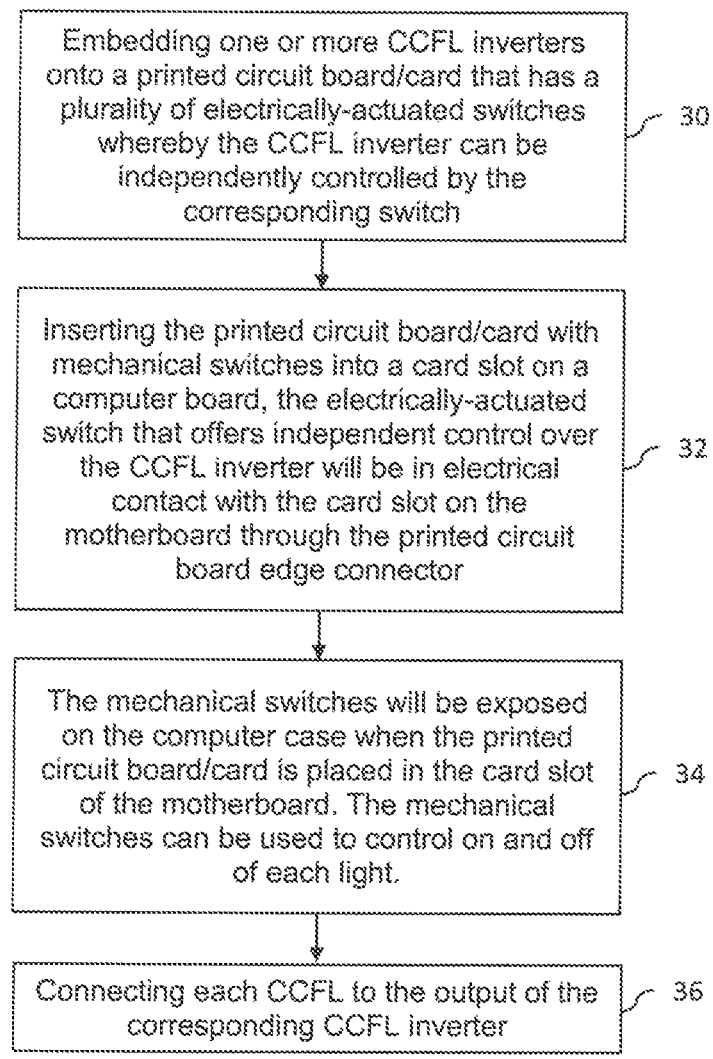
FIG. 3 shows a flow diagram of a method of independently controlling cold cathode florescent lamp (CCFL) lighting within a computer case through electrically-actuated switches or mechanical switches according to the principles of the invention.

Referring to FIG. 2 there is shown a flow diagram of a method of independently controlling cold cathode florescent lamp (CCFL) lighting within a computer case through electrically-actuated switches according to the principles of the invention. First, one or more CCFL inverter is embedded onto a printed circuit board/card that has a plurality of electrically-actuated switches whereby the CCFL inverter can be independently controlled by the corresponding switch, block 20. Then, the printed circuit board/card is inserted into a card slot on a computer board, block 22. Once the printed circuit board/card is inserted, the electrically-actuated switches that offer independent control over the CCFL inverter will be in electrical contact with the card slot on the motherboard through the printed circuit board/card edge connector; each CCFL inverter is independently controlled by its dedicated switch. Finally, each CCFL is connected to the output of the corresponding CCFL inverter, block 24. There may be mechanically actuated switches on the printed circuit board/card to control on and off of each light so that when the edge connector of the printed circuit board/card is placed in the circuit board card slot on the motherboard, it will be exposed and accessible on the computer case, block 34 as shown in FIG. 3.

Figure 4:
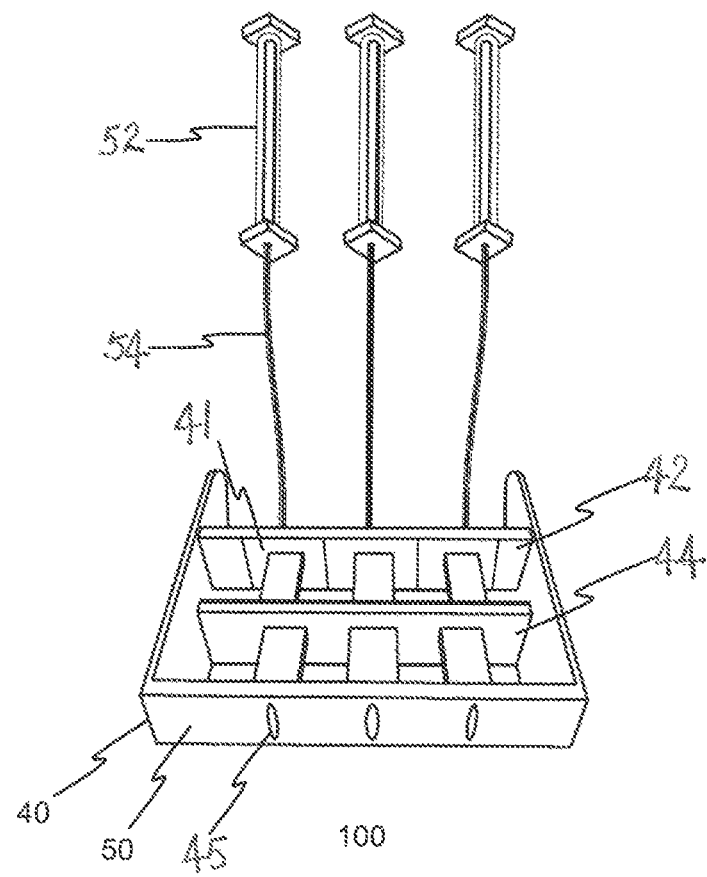
FIG. 4 is an angled top view of a modified baybus having advantages of mounting the inverter circuit boards directly onto the housing of the baybus that contains the switch controller circuit board.
Figure 5:
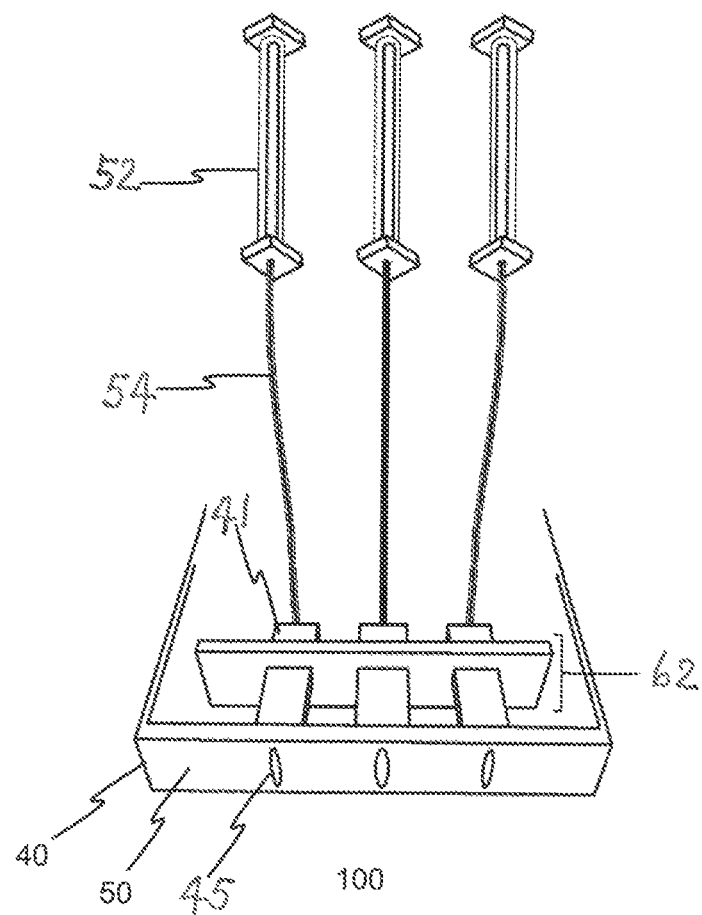
FIG. 5 is an angled top view of a modified baybus having advantages of embedding inverters and switch controllers on the same printed circuit board.

FIG. 4 shows an angled top view of a modified baybus 100 with an inverter circuit board 42 mounted directly onto the interior of the housing 50 of the modified baybus 100 that contains the switch controller circuit board 44. FIG. 5 shows an angled top view of a modified baybus 100 which includes an inverter embedded switch controller circuit board 62 in a front drive bay housing 50, whereby the CCFL inverters 41 make electrical contact with their dedicated switch electrical terminals and the inverter embedded switch controller circuit 62 is attached directly to the housing 50. In both FIG. 4 and FIG. 5 each inverter 41 is provided with its own mechanical switch 45 on the front. Each CCFLs 52 may then be connected to the output of the corresponding CCFL inverter 41 via cables 54.

Figure 6:
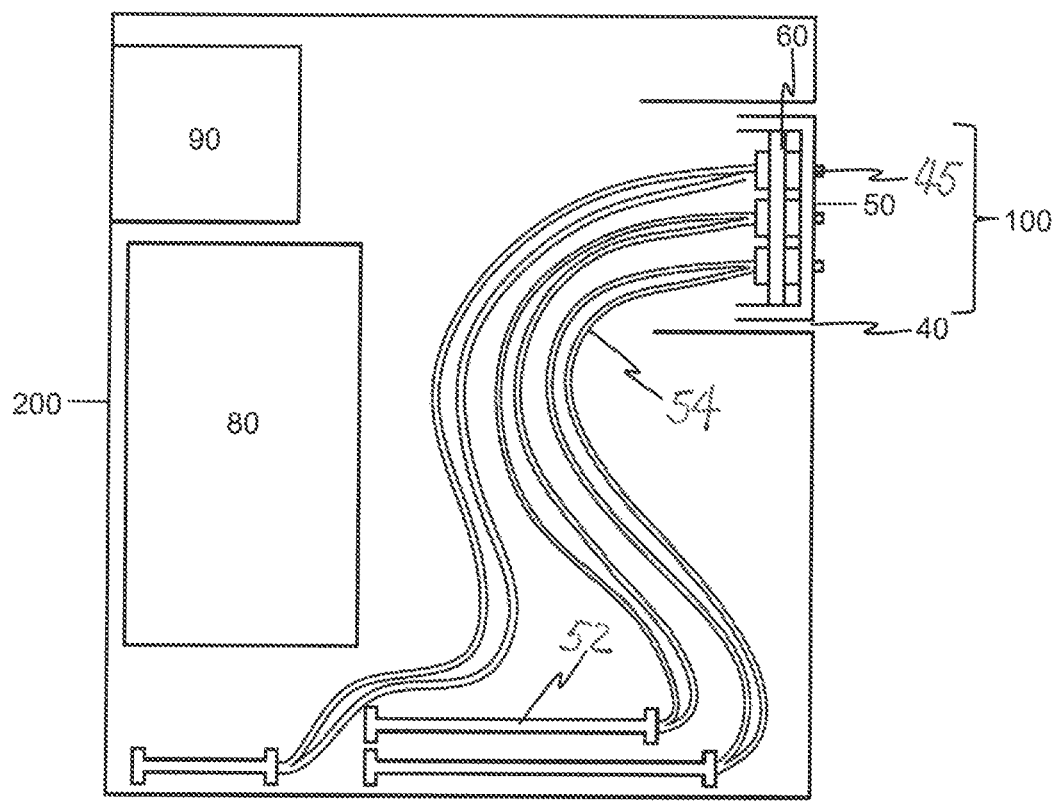
FIG. 6 is a side view of a computer in transparency showing a modified baybus placed into the drive bay of a computer.

FIG. 6 shows a side view of the modified baybus 100 installed within a computer drive bay 40. Such a baybus housing 50 fits a 5.25 inch, 3.5 inch, and/or 2.5 inches drive bay, and/or any standard size drive bays 40 that have been developed in the computer industry.

Figure 7:
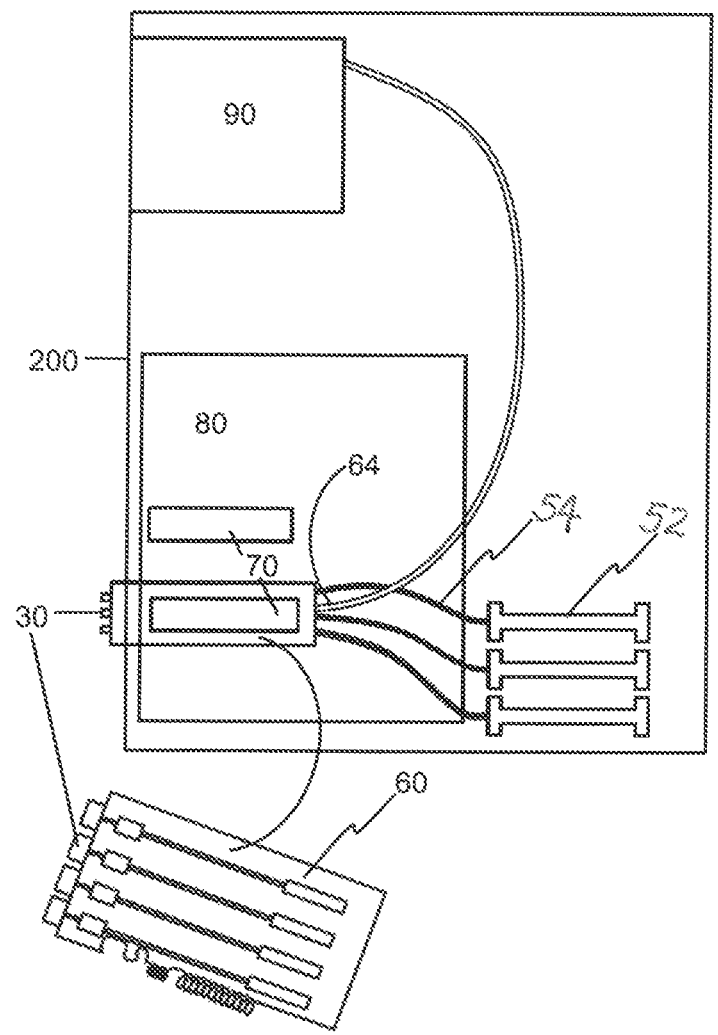
FIG. 7 is a side view of a computer in transparency showing that the inverter modules is placed onto a printed circuit board (e.g. ISA, VESA, PCI, or PCI-Express card) that would insert into a card slot of the computer.

A side view of an embodiment that is assembled according to the aforementioned flow diagram where the CCFL inverters 41 are embedded onto a printed circuit board/card 60 that would insert into a card slot 70 of the computer is shown in FIG. 7. For example, the inverter 41 could be embedded on an ISA, VESA, PCI, or PCI-Express card 60 which then is inserted into an ISA, VESA, PCI, or PCI-Express card slot 70 on the mother board 80. Power may be accessed directly from the card bus, or through an external molex connector 64 that supplies power from the power supply 90 into the printed circuit board/card 60.

The CCFL inverter 41 may be controlled by electrically actuated switches (not shown) via software application through the edge connector (not shown) of the ISA, VESA, PCI, or PCI-Express card 60. Ultimately, the software application controls on and off of each light and their usage. A still further aspect of the embodiment would be the automatic control over the lighting to adjust the color within the computer case, such as based on a timer, a preset algorithm, or based on measurement events such as the amount of processing power being utilized by the computer, the amount of memory being utilized, the temperature of components, or by external triggers obtained through a network, such as the internet. Examples of external triggers could include, but are not limited to, for example, the direction of a stock market index, the temperature or weather, a calendar date, holiday or time of year, or a sports score.

Additionally, mechanical switches 45 offering independent control over the CCFL lights 52 may be located on the rear of the card 60 and once inserted in the card slot/bus 70 is accessible at the rear of the computer case 200.

Alternatively, another embodiment provides a modified baybus 100 containing an embedded CCFL inverter 41 wherein the switch 45 is connected to both a CCFL inverter 41 and a case fan and may be used to control either the CCFL light 52 or the case fan or both.

While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter.

While there have been shown and described and pointed out the fundamental novel features of the invention as applied to the preferred embodiments, it will be understood that the foregoing is considered as illustrative only of the principles of the invention and not intended to be exhaustive or to limit the invention to the precise forms disclosed. Obvious modifications or variations are possible in light of the above teachings. The embodiments discussed were chosen and described to provide the best illustration of the principles of the invention and its practical application to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are entitled.

What is claimed is:

1. A method of independently controlling cold cathode florescent lamp (CCFL) lighting within a computer case comprising:
   a. mounting a plurality of CCFL inverters onto a printed circuit board, each said CCFL inverter is connected to an electrically-actuated switch whereby each said CCFL inverter is independently controlled by said corresponding switch;
   b. inserting said printed circuit board into a card slot on a computer motherboard, once said printed circuit board is inserted, each of said electrically-actuated switch that offers independent control over said corresponding CCFL inverter module is in electrical contact with a card slot on the motherboard through a printed circuit board edge connector on the printed circuit board; and
   c. connecting each CCFL to the output of said corresponding CCFL inverter.

2. The method of independently controlling CCFL lighting according to claim 1, wherein said card slot is one of ISA, VESA, PCI, and PCI-Express card slot.

3. The method of independently controlling CCFL lighting according to claim 1 further comprising providing a software application to control on and off of each light.

4. The method of independently controlling CCFL lighting according to claim 1 further comprising providing a software application to automatically adjust color within the computer case based on a timer.

5. The method of independently controlling CCFL lighting according to claim 1 further comprising providing a software application to automatically adjust color within the computer case based on a preset algorithm.

6. The method of independently controlling CCFL lighting according to claim 1 further comprising providing a software application to automatically adjust color within the computer case by external triggers obtained through the internet.

* * * * *